United States Patent
O'Flaherty et al.

(10) Patent No.: US 6,703,897 B2
(45) Date of Patent: Mar. 9, 2004

(54) METHODS OF OPTIMISING POWER AMPLIFIER EFFICIENCY AND CLOSED-LOOP POWER AMPLIFIER CONTROLLERS

(75) Inventors: Martin J. O'Flaherty, Bishop's Stortford (GB); Roman N. Nemish, Calgary (CA); David M. Tholl, Calgary (CA); Gordon B. Neilson, Calgary (CA); Charles E. Norman, Nepean (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 10/035,879

(22) Filed: Dec. 26, 2001

(65) Prior Publication Data

US 2003/0117215 A1 Jun. 26, 2003

(51) Int. Cl.[7] .................................................. H03F 2/30
(52) U.S. Cl. ....................... 330/149; 330/107; 330/136; 330/129; 330/285; 455/126
(58) Field of Search ................................ 330/107, 136, 330/149, 129, 285; 455/126

(56) References Cited

U.S. PATENT DOCUMENTS

| | | | | |
|---|---|---|---|---|
| 5,138,274 A | * | 8/1992 | Nakanishi et al. | 330/136 |
| 5,142,240 A | * | 8/1992 | Isota et al. | 330/149 |
| 5,144,258 A | * | 9/1992 | Nakanishi et al. | 330/129 |
| 5,892,397 A | * | 4/1999 | Belcher et al. | 330/149 |
| 6,069,530 A | * | 5/2000 | Clark | 330/149 |
| 6,072,364 A | * | 6/2000 | Jeckeln et al. | 330/149 |
| 6,081,161 A | * | 6/2000 | Dacus et al. | 330/297 |
| 6,141,390 A | * | 10/2000 | Cova | 375/297 |
| 6,275,685 B1 | * | 8/2001 | Wessel et al. | 455/126 |
| RE37,407 E | * | 10/2001 | Eisenberg et al. | 330/2 |
| 6,314,142 B1 | * | 11/2001 | Perthold et al. | 375/296 |
| 6,396,345 B2 | * | 5/2002 | Dolman | 330/149 |
| 6,396,350 B2 | * | 5/2002 | Nam | 330/297 |
| 6,519,293 B1 | * | 2/2003 | Miyake | 375/297 |

* cited by examiner

*Primary Examiner*—Michael Tokar
*Assistant Examiner*—Khai Nguyen
(74) *Attorney, Agent, or Firm*—Barnes & Thornburg (57) ABSTRACT

A significant part of the cost of a base station in the cellular mobile radio system is the power amplifier. Thus it is desirable to maximise usage of a power amplifier and in particular to gain the best power output from the amplifier or to improve its efficiency. Such power amplifiers, however, must operate within strict spectral boundaries and thus power amplifiers are typically over-specified in order to ensure that the spectral requirements are met. By measuring the output of the amplifier and determining distortion factors and then adaptively adjusting the operating characteristics of the amplifier, the degree of over-specification of the amplifier required may be reduced with consequent cost and environmental savings.

19 Claims, 9 Drawing Sheets

METHODS OF OPTIMISING POWER AMPLIFIER EFFICIENCY AND CLOSED-LOOP POWER AMPLIFIER CONTROLLERS

FIELD OF THE INVENTION

This invention relates to a closed-loop power amplifier distortion controller and to a method of optimising efficiency in a power amplifier.

BACKGROUND OF THE INVENTION

All power amplifiers introduce distortion to a lesser or greater degree. Distortion may typically be measured in terms of phase and amplitude distortion in which signals passing through the amplifier are subject to undesired phase and amplitude adjustments, i.e. the amplifier has non-linear amplitude and/or phase characteristics. In the case of a power amplifier used for radio frequency transmissions for example for a base station for a cellular mobile radio network, phase and amplitude distortion manifests itself as so-called "regeneration" of frequencies outside the desired transmission frequency. Thus in a situation in which a carrier signal, for example, is being amplified, intermodulation distortion and other distortions introduced through non-linearities in the amplifier create side lobes to the carrier which may violate the transmission requirements by producing unacceptable interference in adjacent channels.

For example, in a wideband CDMA (W-CDMA) 3G cellular system, each channel is allocated 5 MHz of spectrum at frequencies around 1.96 GHz. The so-called 3 dB points are spaced 3.84 MHz apart. These requirements are set to allow adjacent 5 MHz channels to be transmitted without unacceptable interference (and indeed the specification is more detailed than this). Thus, if distortion in the power amplifier (or elsewhere in the base station) causes power to be radiated outside the 3.84 MHz band, other communication channels may be adversely affected and the base station will be operating in violation of the official standards and cannot be used.

Several techniques are known in the prior art for "linearising" power amplifiers in order to overcome this problem. The classical approach is to use a feed forward network around the amplifier which tunes the characteristic of the combination of the amplifier and network to compensate for non-linearity in the amplifier. However, these networks are complex to set up and the network surrounding the main power amplifier requires a second "error amplifier" of similar power capability to the main power amplifier. Since the power amplifier makes up a considerable proportion of the cost of a radio transmitter (for example, for use in a cellular radio communications base station), the cost of an additional amplifier for use as an error amplifier is a significant disadvantage.

Another approach described in co-pending U.S. application Ser. No. 09/945,171 entitled "Amplitude mad Phase Comparator for Microwave Power Amplifier" is to apply so-called "predistortion" to the signals prior to entering the amplifier. Predistortion is typically the application of an inverse phase and amplitude distortion (which is the inverse of the phase and amplitude distortion which it is known will be applied by the amplifier as the signal passes through the amplifier). Thus by applying the inverse distortion to the signal before amplification, the sum of the predistortion and the inherent non-linearities of the power amplifier result in a significant net reduction in the distortion at the output of the amplifier. However, as described below, further improvements to this technique may be made.

Accordingly it is an object of the present invention to provide improvements to distortion control, power amplifier efficiency and/or maximum allowable transmit power over prior art arrangements and in particular for power amplifiers for use in cellular mobile radio base stations.

SUMMARY OF THE INVENTION

In accordance with a first aspect of the invention there is provided a closed-loop power amplifier distortion controller comprising output measuring means operable to measure a predetermined output characteristic of the amplifier output, processing means for processing the measurement produced by the output measuring means, and control means for adjusting an operating parameter of the amplifier responsive to the processed measurement.

The output characteristic may, for example, be phase distortion, amplitude distortion or the frequency spectrum.

In the case at least of phase and or amplitude distortion, it is noted, that this distortion increases dramatically as the clipping point of the amplifier is reached. The clipping point typically is the point at which the output voltage swing approaches the power supply voltages for the amplifier since in typical amplifier designs, the output voltage cannot swing beyond power supply rails. Similarly, clipping may occur when the current supplied by the amplifier exceeds that available from the power supply. Thus phase and amplitude distortion increases dramatically with power output levels at the point that the amplifier clips. If the operating parameter of the amplifier is the power supply voltage and/or the amplifier gain, the gradient of phase and/or distortion error measured at the output of the amplifier against the amplifier power output approaches 1 when clipping occurs. Thus as described below, by adjusting the operating parameter of the amplifier to cause the amplifier to operate just below clipping (as determined by measuring the predetermined output characteristic of the amplifier) the amplifier may be operated at maximum power output (for a given gain and/or power supply voltage) which improves the efficiency.

Similarly, if the output characteristic is the frequency spectrum, the power supply voltage and/or amplifier gain may be varied until the output frequency characteristic is just within an acceptable margin of a desired frequency mask (as discussed in the introduction above). These two approaches typically produce the same result since the frequency mask will be grossly violated (due to phase and amplitude distortion) when the amplifier reaches the clip point and thus operating the amplifier to remain within an acceptable margin of the frequency mask will typically operate the amplifier just at or below its clip point.

In accordance with a second aspect of the invention therefore the invention provides a method of optimising efficiency in a power amplifier comprising measuring an output characteristic of the amplifier which is representative of distortion introduced by the amplifier, and controlling an operational parameter of the amplifier responsive to the measured characteristic.

Using this method to operate the amplifier at or just below its clip point improves efficiency as described below because amplifier efficiency is generally improved when the amplifier is being "driven" hard. Thus typical efficiencies of 18–20% may be achieved by driving the amplifier at or close to its clip point whereas present constructions in which an operating margin must be built into the circuit design to allow for component variations and temperature variations, are only able to achieve amplifier efficiencies of the order of 10%.

As mentioned above, power amplifiers make up a significant proportion cost of a cellular mobile base station. Thus an increase in efficiency means that potentially lower numbers of power amplifiers are required for a given transmitted power, and/or reduced capacity power supplies and cooling plant may be required. All of these reductions are desirable in terms of cost of base stations, and environmental aspects such as the size of the base station and overall electrical efficiency of the base station.

Other aspects and features of the present invention will become apparent to those ordinarily skilled in the art upon review of the following description of specific embodiments of the invention in conjunction with the accompanying figures.

DETAILED DESCRIPTION OF THE PREFERRED EMBODIMENTS

Figure 1:
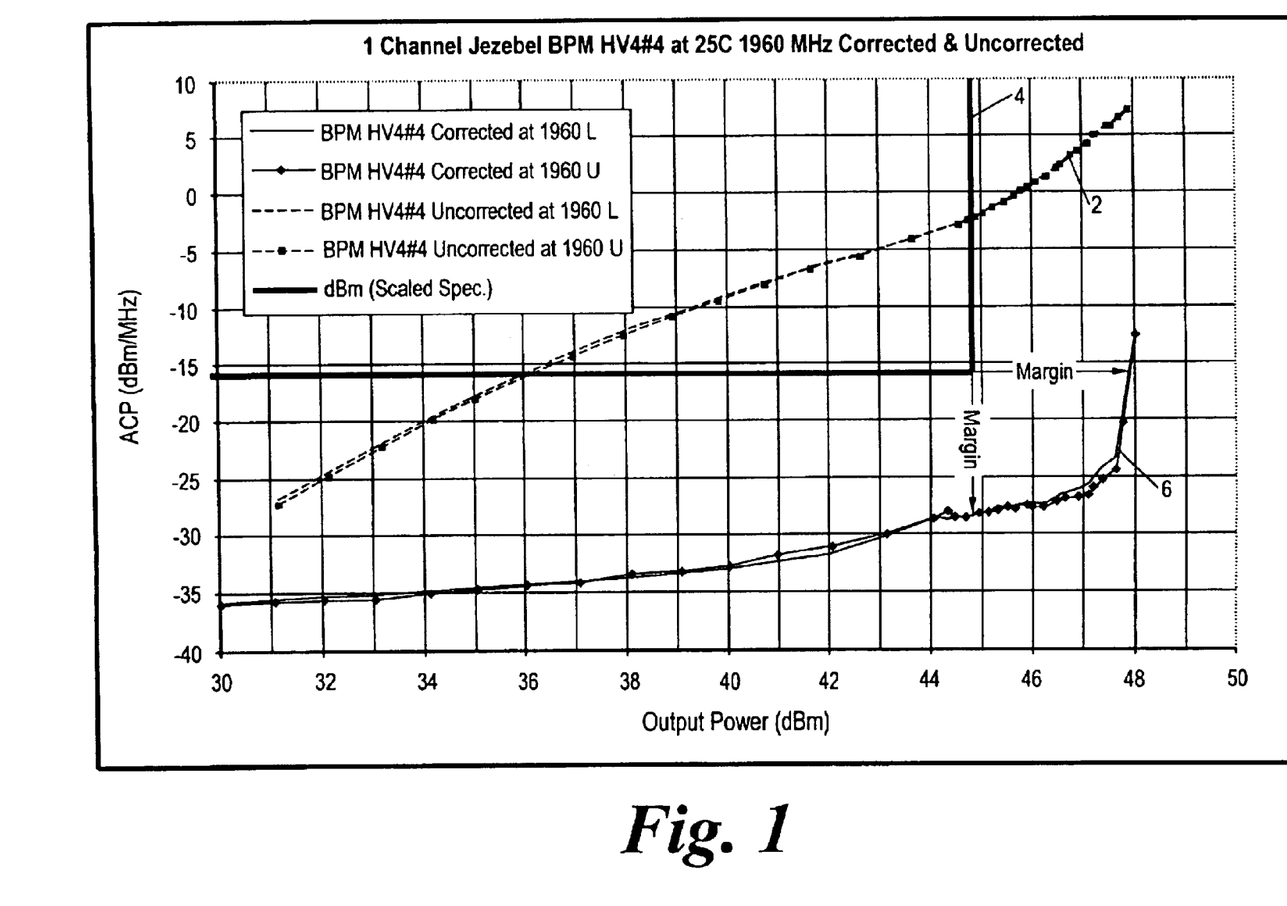
FIG. 1 is a plot showing output power of a power amplifier against adjacent channel power (ACP) in a single channel wideband CDMA (W-CDMA) base station amplifier.

With reference to FIG. 1, a typical plot 2 of power in adjacent channel (adjacent channel power—ACP) against amplifier output power is shown. The line 2 shows a typical amplifier characteristic with no measures taken to deal with non-linearities in the amplifier. The solid line 4 represents the band redefined by the W-CDMA standard. Signals should not enter the area of the graph bounded by the solid line 4 (and which contains the graph key).

Thus it will be noted that the standard uncorrected amplifier fails to meet the standard at output powers greater than about 36 dBm.

The plot 6 represents the same amplifier with predistortion applied to the amplifier as described below. It will be noted, that the amplifier (as shown in this plot) comfortably exceeds the boundary defined in the standard even at power levels approaching 48 dBm. It will also be noted that the gradient of the line 6 approaches 1 at power levels of 48 dBm. This "knee" in the plot represents the clip point of the amplifier. It should also be noted therefore that if the power supply for the amplifier was reduced in voltage, the asymptotic point (presently at about 48 dBm) which represents amplifier clipping, would move down the graph along the horizontal axis, until it reached a point at which the standard boundary were violated. It should also be noted that a different amplifier may have a different clip point and that the clip point may vary with temperature. Thus in practice, a margin must be maintained between the line 6 and the boundary 4 so that under all operating conditions, the boundary requirements are met.

Figure 2:
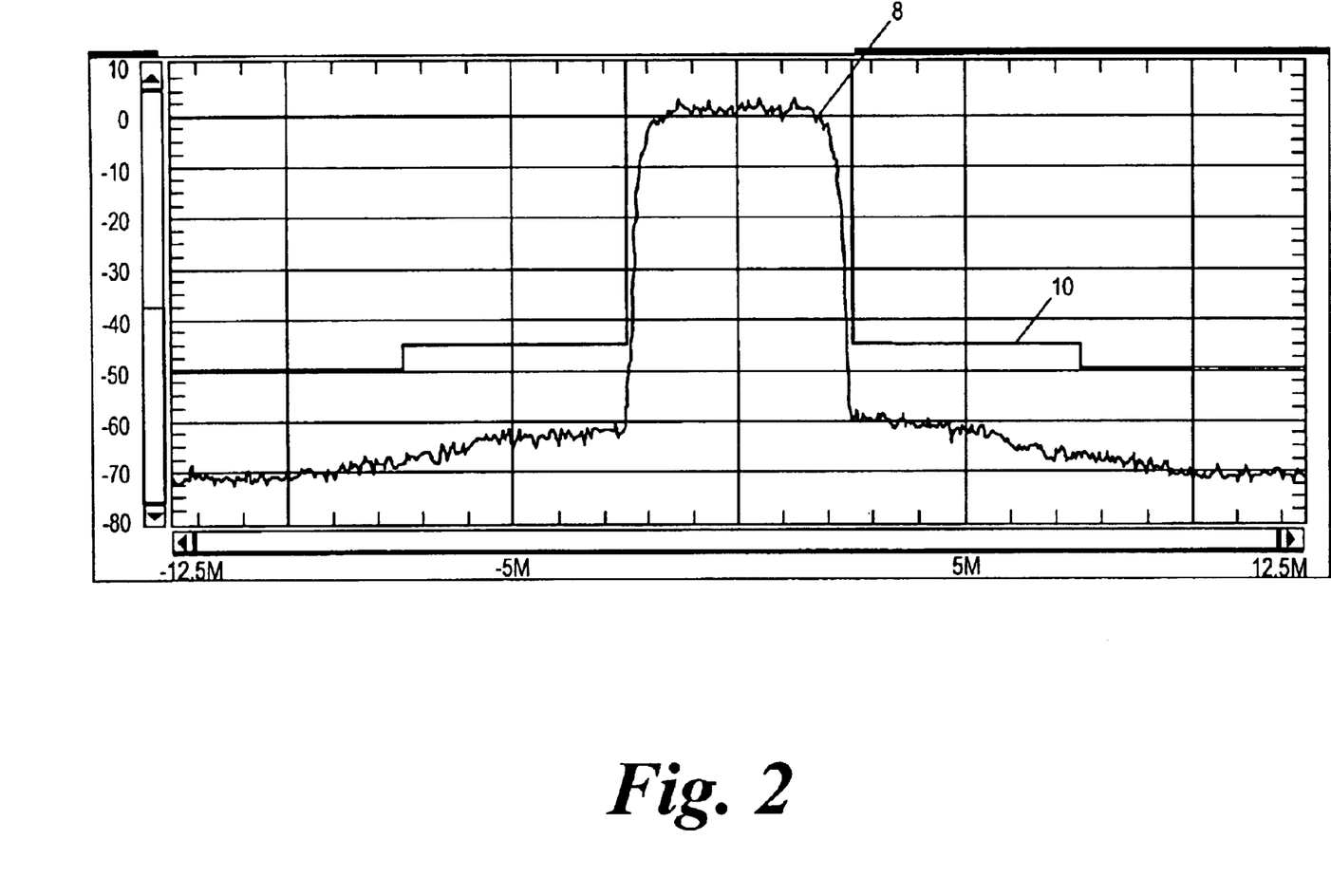
FIG. 2 is a plot showing a typical W-CDMA signal at 5 MHz channel spacings and a desired frequency mask.

FIG. 2 shows a typical W-CDMA single channel spectrum. The plot 8 represents a transmitted signal (i.e. the output of the power amplifier) and the stepped line 10 represents the standard frequency mask. The spectrum shown in FIG. 2 complies with the mask. However, at the point at which the adjacent channel power violates the boundary 4 of FIG. 1, it would expected that the spectrum of FIG. 2 would violate the frequency mask.

Figure 3:
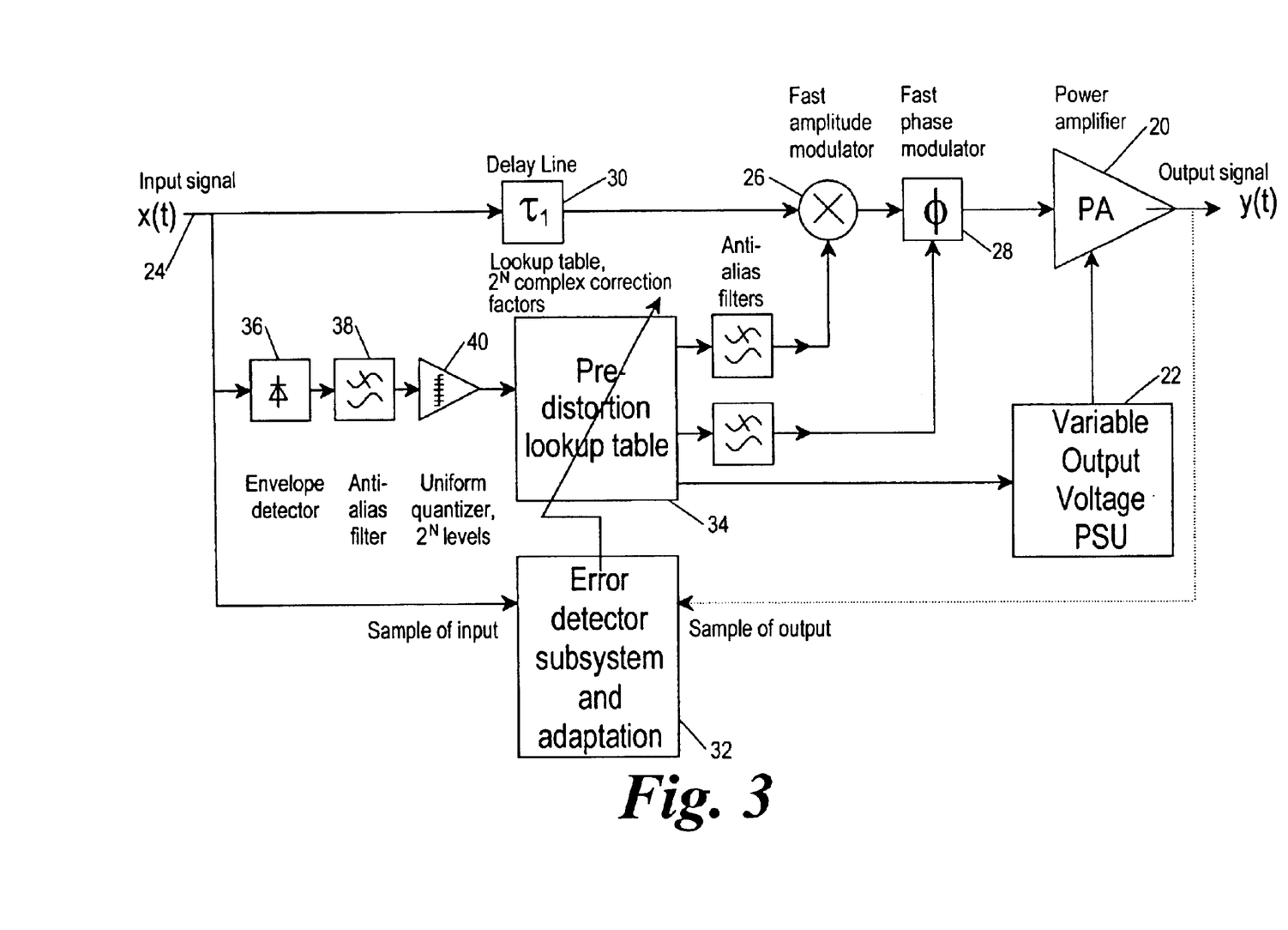
FIG. 3 is a schematic block diagram showing a predistortion circuit arrangement.
Figure 4:
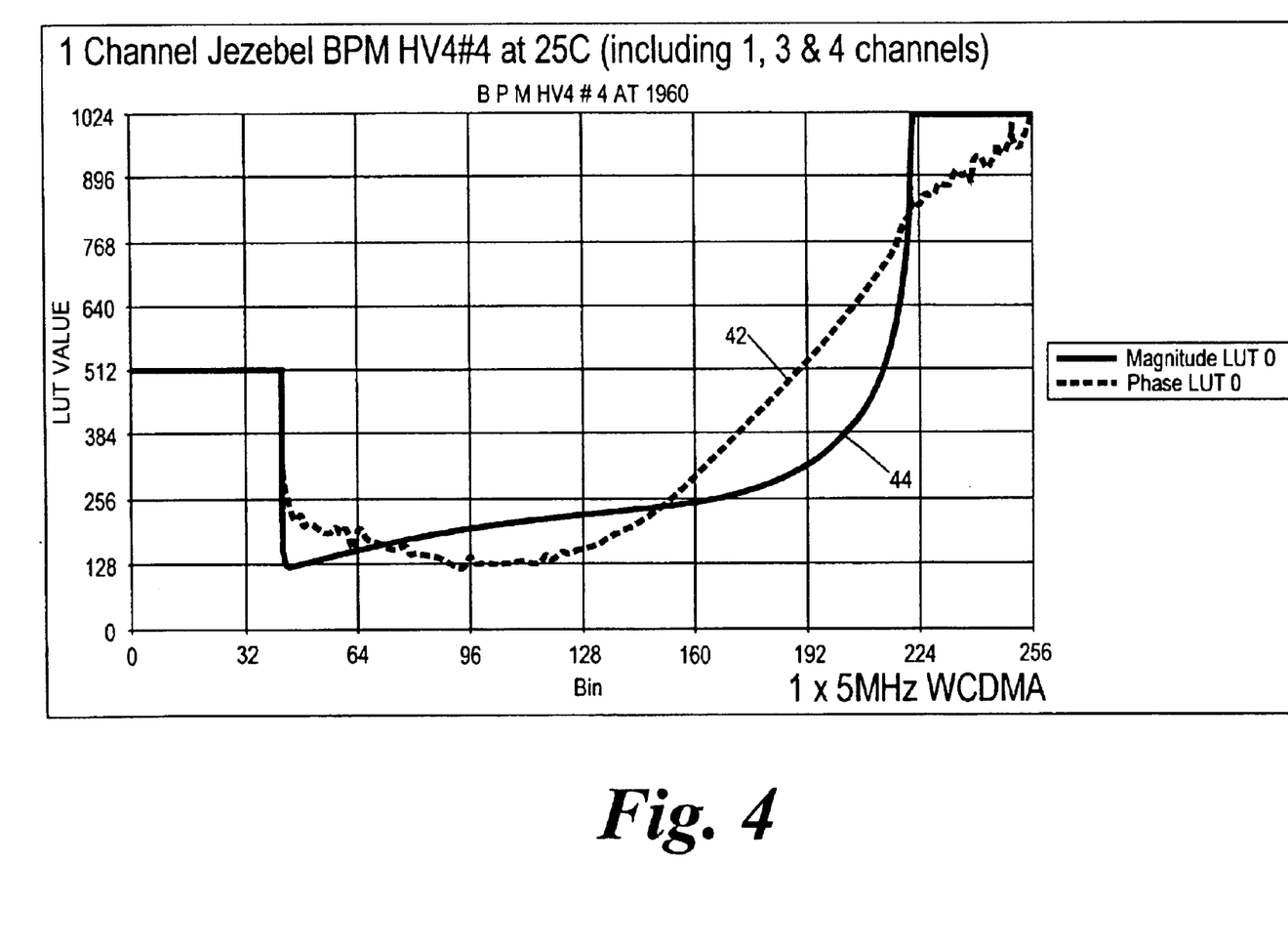
FIG. 4 is a schematic plot showing applied amplitude and phase predistortion with increasing amplifier power output for a single channel 5 MHz W-CDMA base station.

The reason for this may be seen with reference to FIGS. 3 and 4.

FIG. 3 shows a modified arrangement for introducing predistortion into an amplifier to compensate for non-linearities within the amplifier.

A power amplifier 20 has a variable output voltage power supply unit 22. An input signal 24 is fed into the input of the power amplifier via an amplitude modulator 26 and a phase modulator 28. (The delay line 30 is required simply to allow time for predistortion to be applied to the signal and may for the purposes of this explanation be ignored).

A small portion (typically inductively coupled) of the output signal is fed back to an error detector subsystem 32 which compares a sample of the output with a sample of the input signal and carries out phase and amplitude error measurements. An envelope detector 36 and associated anti-aliasing filter 38 and quantizer 40 provides a quantized index for a predistortion look-up table 34. It will be noted for example from FIG. 1, distortion increases (generally speaking) with amplifier power output and therefore with envelope magnitude.

The look-up table 34 contains mappings between measured input envelope and desired input (drive) values for the phase and amplitude modulators 28 and 26 required to correct for the phase and amplitude distortion generated by the amplifier.

The contents of the look-up table are adjusted using feed-back of the actual measured phase and amplitude distortion at each envelope value 36 using the error detector subsystem and adaptation 32.

Thus, the error detector subsystem 32 and the look-up table 34 co-operate to produce suitable predistortion values to be applied by the amplitude and phase modulators 26 and 28 to compensate for the measured distortion.

With particular reference to FIG. 4, the plot 42 shows look-up table values for phase correction (which corresponds to the amount of phase correction applied by the phase modulator 28) and look-up table values for the magnitude (or amplitude) correction applied by the amplitude modulator 26. The horizontal axis shows the values supplied by the envelope detector which is proportional to amplifier output power. Thus, it will noted that the amplitude predistortion becomes asymptotic at a quantized power value of just less than 224. This is the point at which distortion inherent in the amplifier is so great that it cannot be corrected by predistortion (and in practice corresponds to the clip point of the amplifier).

By modifying to this predistortion arrangement, it is possible to adaptively force the amplifier to operate within a predetermined small margin of the clip point (which as explained below offers greatly improved amplifier efficiency). Thus it will be noted that one particularly simple way of determining whether the clip point is about to be reached is to set a maximum target value for the operating position on the amplitude correction curve of FIG. 4 and to vary some controllable parameter to achieve such operation.

Clearly, it is not practical to vary the input signal since such variation is the realm of systems (not shown) earlier in the signal path. The function of the system shown in FIG. 3 is simply to amplify the signal at its input without introducing so much distortion that the standards defining transmission bandwidths etc. are violated.

However, two exemplary parameters which may be varied are, for example, the voltage of the amplifier power supply and/or the gain of the system. In the embodiment shown in FIG. 3, a variable output voltage power supply unit 22 supplies power to the amplifier and is controlled based on the operating position on the predistortion look-up table. As discussed above, a reduction in the power supply voltage typically will reduce the output power which may be produced by the amplifier without clipping. Thus a reduction in the power supply voltage level may cause the amplifier to operate close to its clip point (i.e. may move the asymptotic portion of the line 44 in FIG. 4, towards the left of the graph).

Figure 5A:
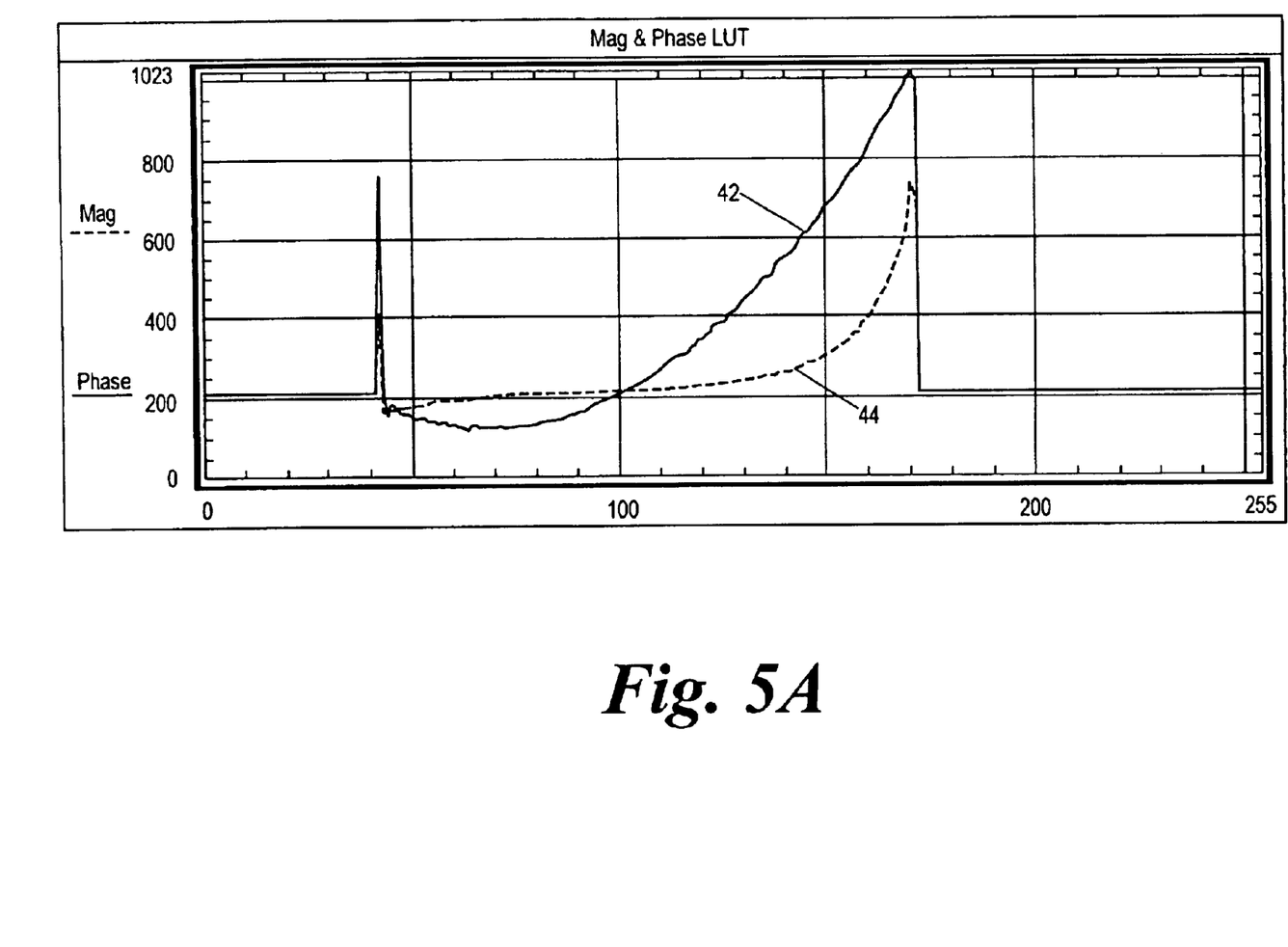
FIG. 5A is a schematic plot of an internal amplitude and phase look-up table used for the predistortion arrangement of FIG. 3.
Figure 5B:
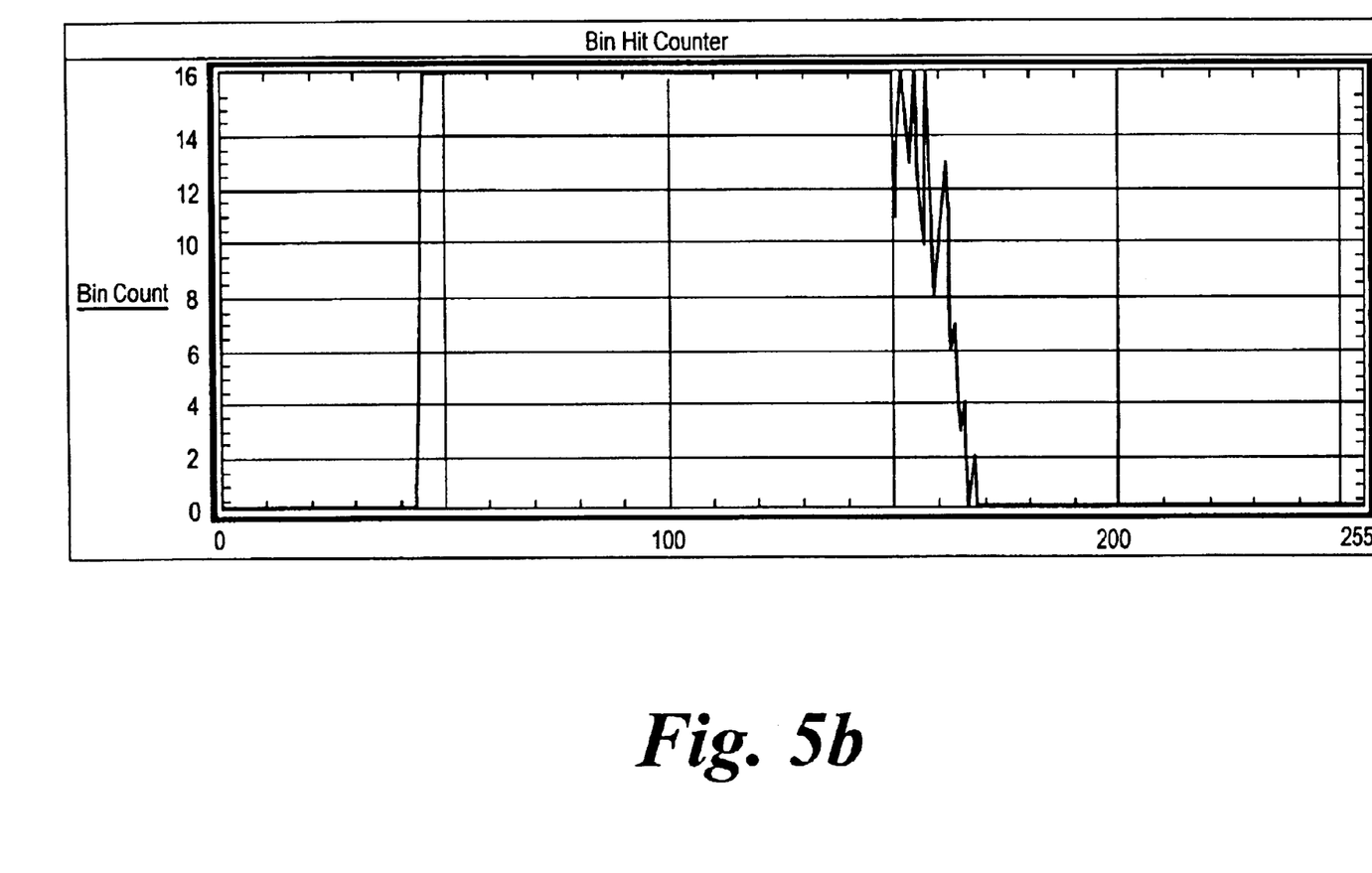
FIG. 5B is a schematic plot of an internal input envelope bin counter used for the predistortion arrangement of FIG. 3.

FIG. 5B shows an input envelope 'bin counter'. This 'bin counter' records the number of times during the last adaption cycle that each input envelope value was recorded. (In this implementation the counter stops at 16). The bin counter gives the system knowledge of the input signal envelope range during the last count (adaption) period. FIG. 5B shows that during the last adaption period the highest input signal envelope was recorded at a value of approximately 170. This knowledge is combined with data from the correction look up tables (FIG. 5A) to determine how close the system is to clip. If the amplitude and/or phase correction values in the look up table are below their maximum allowed values at the peak input level, then the system is operating above clip.

Thus with reference to FIGS. 5A and 5B, by setting a target value for the amplitude correction for example in terms of the look-up table values (in FIG. 5A the target value is 1000 for line 44), a feedback algorithm may be used to reduce the power supply voltage until the maximum applied amplitude predistortion corresponds to a value of 1000 in the look-up table. This allows an additional 23 values as a margin (it will be noted that the values given in the plots of FIGS. 4 and 5 are binary values which is a consequence of the use typically of digital to analogue converters for controlling the variable voltage passed by unit 22 and the modulators 26 and 28).

Other techniques may be used. For example, a significant steepening of the phase and/or amplitude curves 42 and 44, outside expected limits may signal the onset of clipping.

Figure 6:
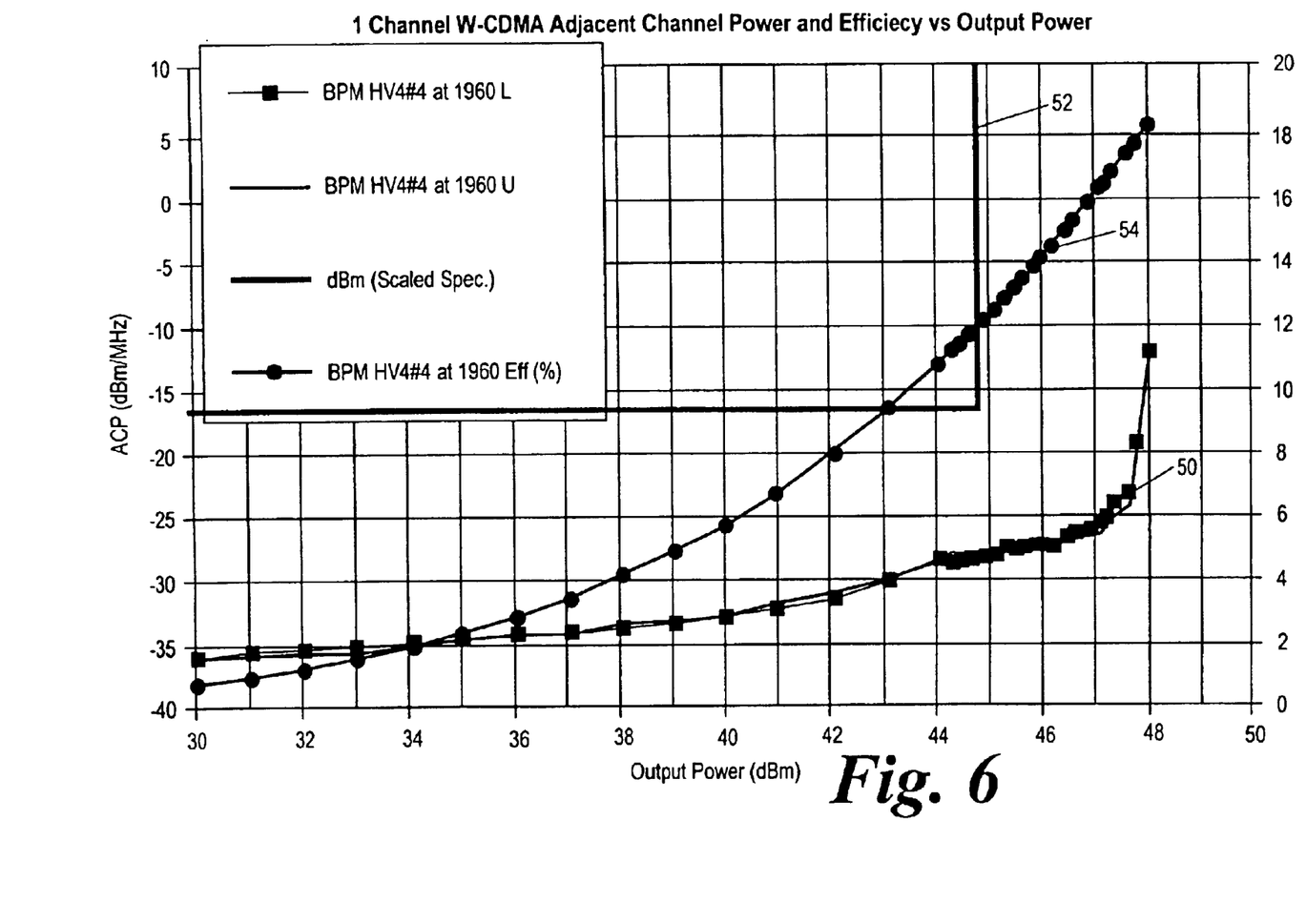
FIG. 6 is a schematic plot showing amplifier efficiency and adjacent channel power against amplifier output power.
Figure 7:
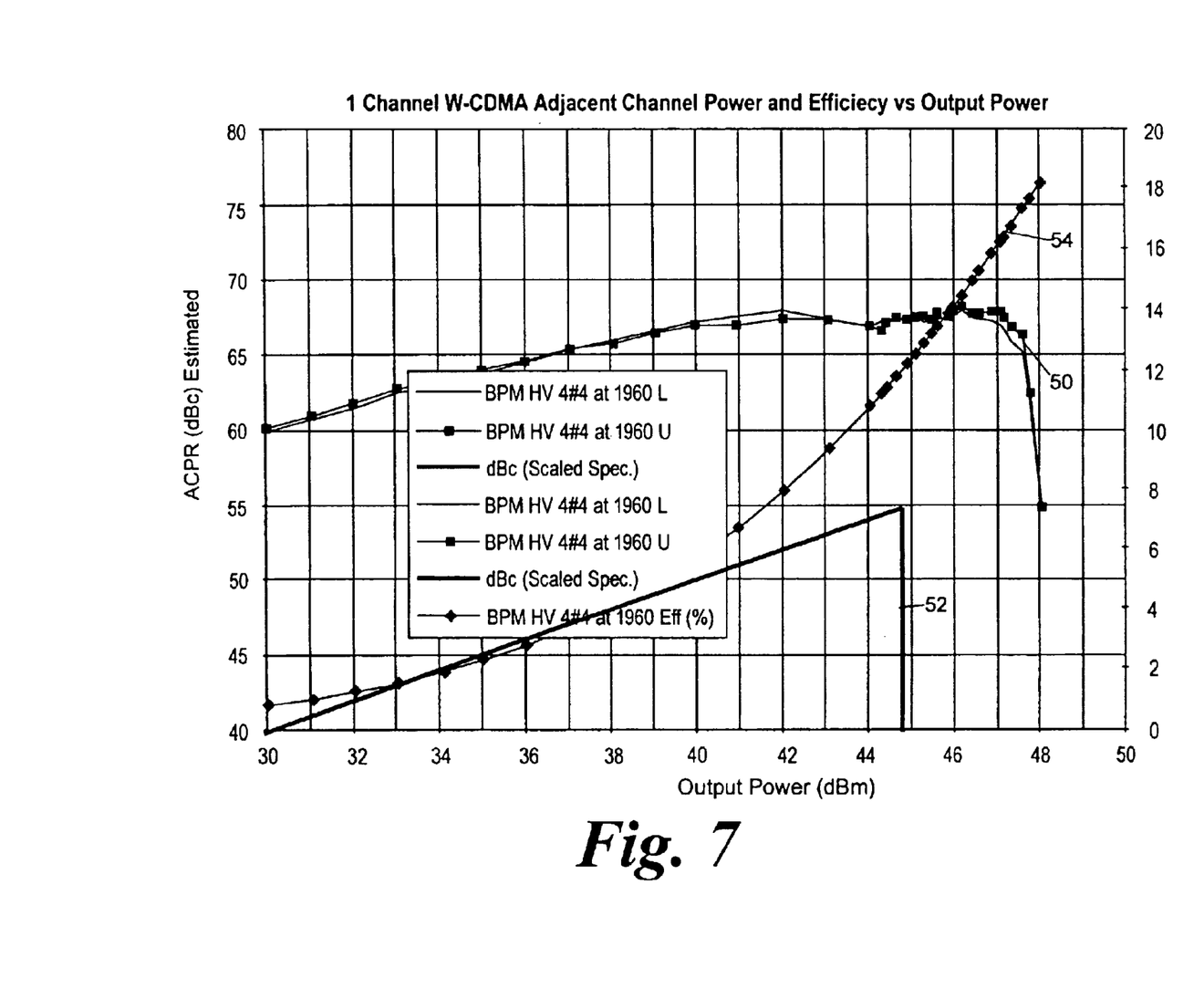
FIG. 7 is a further plot showing adjacent channel power ratio (ACPR) and amplifier efficiency against amplifier output power.

The advantage of operating the amplifier close to its clip point may clearly be seen with reference to FIGS. 6 and 7. The lines 50 in the two graphs represent adjacent channel power (adjacent channel power ratio in FIG. 7) and therefore correspond to distortion in the amplifier power output. In common with the graph of FIG. 1, it will be seen that the lines 50 have a knee and an asymptotic portion which corresponds to amplifier clipping. The solid lines 52 also correspond to the defined boundaries in the transmission standards which must not be violated in order to meet the standards. The other lines 54 represent amplifier efficiency (in terms of DC power in versus RF power out). It will be noted that the amplifier efficiency increases dramatically as operation of the amplifier occurs closer to the clip point. Typically, once margin is allowed for component variations, temperature variations etc., amplifiers in base stations are operated at around the 10% efficiency margin. Thus by operating the amplifier close to the clip point, substantial savings may be made (a difference from 10% to 18% which is an increase of 180% in efficiency).

Thus by adaptively tailoring the clip point of the amplifier to the short term power output requirements of the amplifier (in order to ensure that the amplifier is always being driven close to its clip point), dramatic efficiency improvements may be made with the consequent cost and environmental improvements discuss above.

In the embodiment described above, the output characteristic of the amplifier which has been measured is phase and/or amplitude distortion. An alternative technique is described below which involves the use of a spectral analysis of the output signal. This technique allows a power amplifier to be used at or very close to its maximum power output thus reducing the margin which is required to allow for worst case operating conditions and/or unit-to-unit variations and also potentially offering the efficiency benefits discussed above. It will be appreciated also that both techniques could be used together.

In this embodiment, a simple receiver (which may for example mix the signal down to an intermediate frequency or base band) is applied to the output of the amplifier and a simple spectrum analyser (for example implemented in an FPGA or ASIC component) is used to process the "received" signal.

Figure 8:
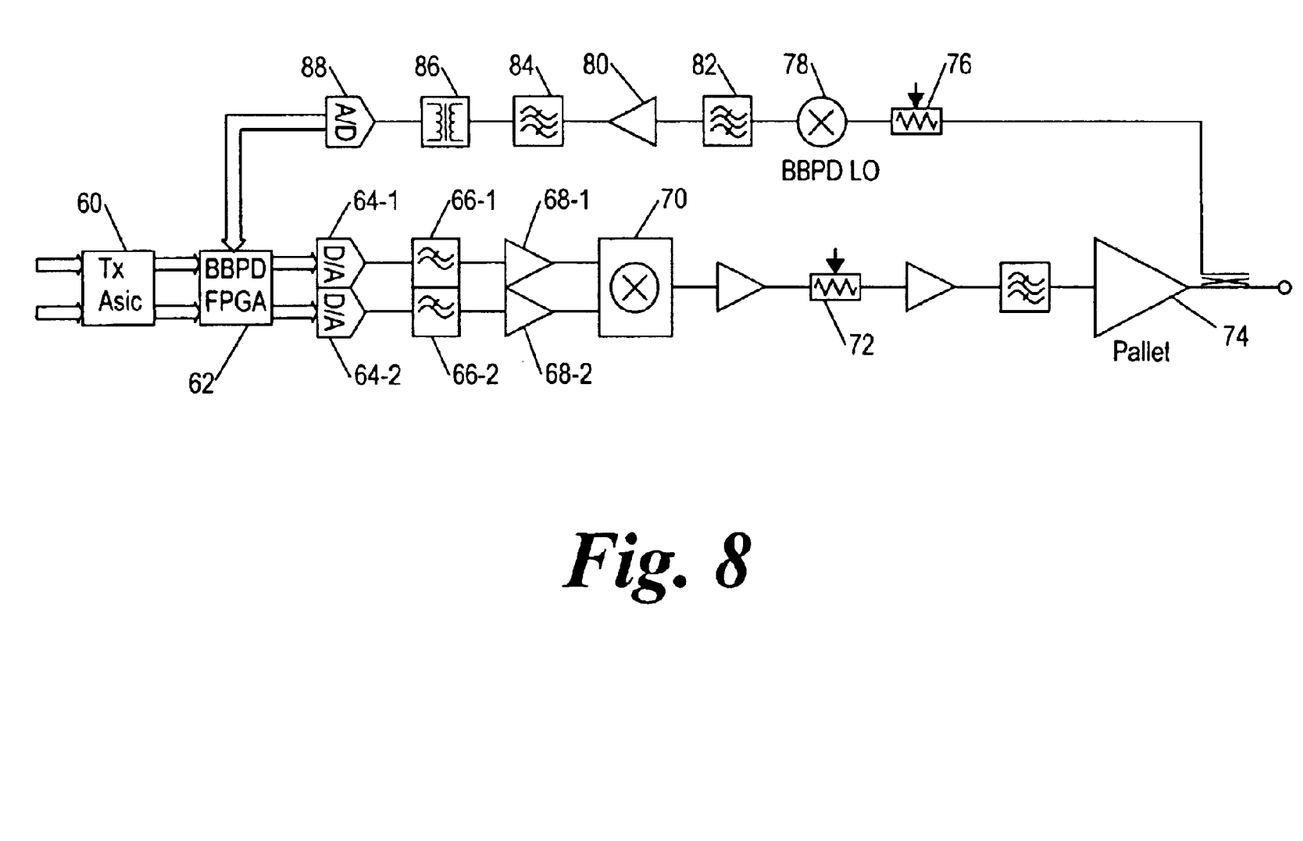
FIG. 8 is a schematic block diagram showing a spectral analyser circuit arrangement.

Thus, with reference to FIG. 8, a base station includes a transmit application specific integrated circuit (ASIC) 60 which provides a two channel input into a BBPD field programmable gate array (FPGA). The output of the FPGA is fed into a pair of digital-to-analog converters 64-1 and 64-2 and then to a pair of anti-aliasing filters 66-1 and 66-2. The signal is then amplified and up-mixed together using a pair of amplifiers 68-1 and 68-2 and a mixer 70.

The signal is then buffered and passed through a variable gain device 72. After band pass filtering, the signal is passed to a power amplifier 74. With the exception of the FPGA 62, this is the generally conventional arrangement.

However, the circuit of FIG. 8 has been furthered modified with the addition of a feedback loop which takes an inductive 'sniff' from the output of the power amplifier 74 and includes a variable gain device 76, a downmixer 78.an amplifier 80 and a pair of bandpass filter 82 and 84. The feedback signal is then isolated (isolator 86) and sampled using an analog-to-digital converter 88. The digitised, downmixed signal is then fed back into the FPGA 62.

Within the FPGA 62, the signal may be compared with the frequency mask (for example the type of mask shown in FIG. 2) and the amplifier output power adjusted accordingly using the variable gain devices 72 and/or 76 until it is determined that it does not violate to frequency mask 10. The gain of the amplifier or the gain of the transceiver may be varied in order to maximise output power for a given amplifier and power supply voltage (as is also possible for the first embodiment) or the power supply voltage may be varied in order to improve amplifier efficiency consistent with meeting the frequency mask 10 of FIG. 2 as described above.

A particular advantage of implementing an integral spectrum analyser (in addition to ensuring compliance with the frequency mask) is that other qualitative measurements may be made on the signal, for example wave form quality, error vector magnitude and/or code domain noise. This may be measured and monitored remotely. This may further reduce base station operating costs since it may be used to reduce the frequency of visits which are required to a particular base station sight. Thus in both the embodiments given above, the measurements of the output may be used to provide an integral diagnostic capability. This may be achieved, for example, by including typical values in the base station processing hardware which are compared with the measured values. When the measured values differ from the stored values by more than a predetermined amount, an error may be flagged since this may represent a developing or developed fault within the base station.

What is claimed is:

1. A closed-loop power amplifier distortion controller comprising:—
   (a) a closed-loop pre-distortion control arranged to apply pre-distortion to the amplifier input signal automatically based on a measured predetermined output characteristic;
   (b) measuring means operable to measure the amount of applied pre-distortion which is representative of distortion introduced by the amplifier; and
   (c) control means for adjusting an operating parameter of the amplifier responsive to the amount of applied pre-distortion.

2. A controller according to claim 1, wherein the said predetermined output characteristic is phase distortion.

3. A controller according to claim 1, wherein the said predetermined output characteristic is amplitude distortion.

4. A controller according to claim 1, wherein the said predetermined output characteristic is the frequency spectrum.

5. A controller according to claim 1, wherein the said operating parameter is the output voltage of a power supply arranged to supply power to the power amplifier.

6. A controller according to claim 1, wherein the said operating parameter is the gain of the power amplifier.

7. A method of optimising efficiency in a power amplifier comprising:
   (a) applying pre-distortion to the amplifier input signal automatically based on a measured output characteristic,
   (b) measuring the amount at applied pre-distortion which is representative of distortion introduced by the amplifier, and
   (c) controlling an operational parameter of the amplifier responsive to the amount of applied pre-distortion.

8. A method according to claim 7, further comprising processing the output characteristic measure to determine a gradient of that measure against change in the operational characteristic, and periodically adjusting the operational parameter to substantially achieve a desired value for the said gradient.

9. A method according to claim 8 wherein the measured output characteristic is phase distortion and wherein the desired gradient approaches infinity which is representative of clipping distortion in the amplifier.

10. A method according to claim 8 wherein the measured output characteristic is amplitude distortion and wherein the desired gradient approaches infinity which is representative of clipping distortion in the amplifier.

11. A method according to claim 8 wherein the operational parameter is the voltage of the electrical supply for the power amplifier.

12. A method according to claim 8 wherein the operational parameter is the gain of the amplifier.

13. A method according to claim 7, further comprising comparing the output characteristic measure against a predetermined threshold and periodically adjusting the operational parameter to maintain the measured output characteristic on a desired side of the said threshold.

14. A method according to claim 13 wherein the output characteristic measure is the frequency spectrum of the output and the threshold is a predetermined spectral mask.

15. A method according to claim 13, wherein the output characteristic measure is the waveform quality of the output.

16. A method according to claim 13, wherein the output characteristic measure is the error vector magnitude.

17. A method according to claim 13, wherein the output characteristic measure is code domain noise in the output.

18. A base station for a radio network including:—
   (a) a power amplifier, and
   (b) a closed-loop power amplifier distortion controller including a closed-loop pre-distortion control arranged to apply pre-distortion to the amplifier input signal automatically based on a measured predetermined output characteristic; measuring means operable to measure the amount of applied pre-distortion which is representative of distortion introduced by the amplifier; and control means for adjusting an operating parameter of the amplifier responsive to the amount of applied pre-distortion.

19. A wireless communications network including a base station having:—
   (a) a power amplifier, and
   (b) a closed-loop power amplifier distortion controller including a closed-loop pre-distortion control arranged to apply pre-distortion to the amplifier input signal automatically based on a measured predetermined output characteristic; measuring means operable to measure the amount of applied pre-distortion which is representative of distortion introduced by the amplifier, and control means for adjusting an operating parameter of the amplifier responsive to the amount of applied pre-distortion.

* * * * *